United States Patent
Lin et al.

(10) Patent No.: US 9,019,780 B1
(45) Date of Patent: Apr. 28, 2015

(54) NON-VOLATILE MEMORY APPARATUS AND DATA VERIFICATION METHOD THEREOF

(71) Applicant: eMemory Technology Inc., Hsinchu (TW)

(72) Inventors: Yih-Lang Lin, Taipei (TW); Chen-Hao Po, Hsinchu (TW)

(73) Assignee: eMemory Technology Inc., Hsinchu (TW)

( * ) Notice: Subject to any disclaimer, the term of this patent is extended or adjusted under 35 U.S.C. 154(b) by 0 days.

(21) Appl. No.: 14/048,048

(22) Filed: Oct. 8, 2013

(51) Int. Cl.
*G11C 7/10* (2006.01)

(52) U.S. Cl.
CPC ................................. *G11C 7/1084* (2013.01)

(58) Field of Classification Search
CPC ........ G11C 11/34; G11C 16/06; G11C 16/04; G11C 16/34; G11C 16/02; G11C 29/00
USPC ............. 365/185.22, 185.03, 185.18, 185.21, 365/189.05, 230.08
See application file for complete search history.

(56) References Cited

U.S. PATENT DOCUMENTS

| | | | |
|---|---|---|---|
| 7,898,876 B2 | 3/2011 | Yang et al. | |
| 8,174,888 B2 | 5/2012 | Lee et al. | |
| 8,279,678 B2 | 10/2012 | Lim et al. | |
| 8,432,746 B2 | 4/2013 | Hung et al. | |
| 2009/0129149 A1* | 5/2009 | Fujisawa et al. | 365/185.03 |
| 2013/0044543 A1 | 2/2013 | Kim | |

* cited by examiner

*Primary Examiner* — Thong Q Le
(74) *Attorney, Agent, or Firm* — Jianq Chyun IP Office

(57) ABSTRACT

A non-volatile memory apparatus and a data verification method thereof are provided. The non-volatile memory apparatus includes a plurality of memory cells, a page buffer, a write circuit, a sense amplifier, and a sense and compare circuit. The page buffer stores a plurality of buffered data and programs the plurality of memory cells according to the plurality of buffered data. The write circuit receives a program data or a rewrite-in data and writes the program data or the rewrite-in data to the page buffer. The sense amplifier senses data read from the memory cells for generating a read-out data. The sense and compare circuit reads the buffered data, and compares the read-out data and a compared buffered data to generate a rewrite-in data. The sense and compare circuit determines the rewrite-in data to be the buffered data or an inhibiting data according to the compared result.

6 Claims, 6 Drawing Sheets

NON-VOLATILE MEMORY APPARATUS AND DATA VERIFICATION METHOD THEREOF

BACKGROUND OF THE INVENTION

1. Field of Invention

The present invention generally relates to a non-volatile memory apparatus, and more particularly to a data verification method for the non-volatile memory apparatus.

2. Description of Prior Art

Along with the rapid development of science and technology at the present, a non-volatile memory is widely used in an electronic apparatus. The non-volatile memory, for example a flash memory, is used to store information for the electronic apparatus, and the accuracy of the non-volatile memory is important for the electronic apparatus.

Nowadays, a multi-pulse method and a multi-level method can be used to program the memory cells of the non-volatile memory. By using the multi-pulse method and the multi-level method to program the non-volatile memory, the endurance of the memory cells of the non-volatile memory can be improved. Accordingly, a verification for a data programming operation of the non-volatile memory is necessary. The verification action is used to enhance cycling of memory cells by inhibiting the memory cells which is verified pass.

SUMMARY OF THE INVENTION

The present invention provides a non-volatile memory apparatus and a data verification method thereof for increasing an accuracy of data in the non-volatile memory apparatus.

The non-volatile memory apparatus includes a plurality of memory cells, a page buffer, a sense amplifier, a write circuit, and a sense and compare circuit. The page buffer is coupled to the memory cells. The page buffer stores a plurality of buffered data and programs the plurality of memory cells according to the plurality of buffered data. The write circuit coupled to the page buffer receives a program data or a rewrite-in data and writes the program data or the rewrite-in data to the page buffer. The sense and compare circuit is coupled to the page buffer and the write circuit. The sense and compare circuit reads a read-out data from the memory cells and the buffered data. The sense amplifier senses data read from the memory cells for generating the read-out data. The sense and compare circuit compares the read-out data and the buffered data to generate a compared result. The sense and compare circuit determines the rewrite-in data to be the program buffered data or an inhibiting data according to the compared result.

The data verification method for the non-volatile memory apparatus includes: reading a read-out data from a plurality of memory cells and a buffered data from a page buffer by a sense and compare circuit; comparing the read-out data and a buffered data to generate the rewrite-in data by the sense and compare circuit; determining a rewrite-in data to be the buffered data or an inhibiting data according to the read-out data and the buffered data; receiving the rewrite-in data and writing the rewrite-in data to the page buffer for generating the buffered data by a write circuit; and programming the buffered data to the memory cells.

Accordingly, the disclosure provides a sense and compare circuit for comparing the read-out data and the buffered data, and the sense and compare circuit generates a rewrite-in data according to the compared result. The write circuit programs the buffered data formed by one or more rewrite-in data to the memory cells one or more times till all buffered data are inhibiting. That is, the program data can be written to the memory cells correctly, and a high accuracy of the non-volatile memory is obtained.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
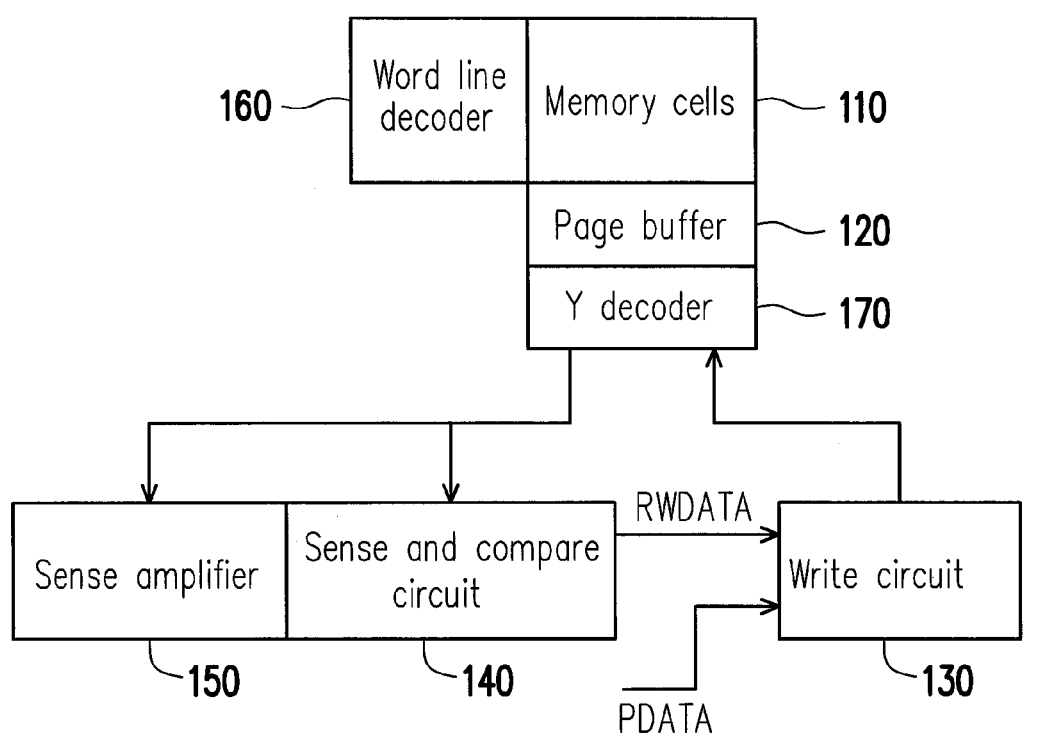
FIG. 1 is a block diagram of a non-volatile memory apparatus according to an embodiment of the present invention.

Reference will now be made in detail to the present preferred embodiment of the invention, examples of which are illustrated in the accompanying drawings. Wherever possible, the same reference numbers are used in the drawings and the description to refer to the same or like parts.

Please referring to FIG. 1, FIG. 1 is a block diagram of a non-volatile memory apparatus according to an embodiment of the present invention. The non-volatile memory apparatus 100 includes a plurality of memory cells 110, a page buffer 120, a write circuit 130, a sense and compare circuit 140, a sense amplifier 150, a word line decoder 160 and a Y decoder 170. The page buffer 120 is coupled to the memory cells 110. The page buffer 120 stores a plurality of buffered data and programs the plurality of memory cells 110 according to the plurality of buffered data. In FIG. 1, the write circuit 130 is coupled to the page buffer 120 through the Y decoder 170, wherein, the Y decoder 170 is coupled to the page buffer 120. The write circuit 130 receives a program data PDATA or a rewrite-in data RWDATA and writes the program data PDATA or the rewrite-in data RWDATA to the page buffer 120. The sense amplifier 150 coupled to the Y decoder 170 senses the data read from the memory cells 110 for generating a read-out data. The sense and compare circuit 140 coupled to the write circuit 130 and coupled to the page buffer 120 through the Y decoder 170 may reads the read-out data and the buffered data in the page buffer 120. Then a compared buffered data is selected from one of the buffered data. The sense and compare circuit 140 further compares the read-out data and the compared buffered data to generate a compared result. Furthermore, the rewrite-in data RWDATA is determined by the sense and compare circuit 140 according to the compared result. In the embodiment, the sense and compare circuit 140 determines the rewrite-in data RWDATA to be the compared buffered data or an inhibiting data according to the compared result.

In detail, when a verification operation is operated, the sense and compare circuit 140 reads the buffered data from the page buffer and the read-out data from the memory cells 110. For example the buffered data may be a 16 byte data, and the read-out data may be a 16 byte data. Firstly, the sense and compare circuit 140 may select the first byte of the buffered data to be the compared buffered data, and the sense and compare circuit 140 compares the compared buffered data and the first byte of the read-out data. If the read-out data is logic low in a program state, the rewrite-in data RWDATA is the inhibiting data correspondingly. If the read-out data is logic high in an erase state, a value of the rewrite-in data RWDATA is not changed. Secondary, the sense and compare circuit 140 read another read-out data (byte) form the memory cells 110, and selects the second byte of the buffered data to be the compared buffered data. The sense and compare circuit 140 compares the second byte of the read-out data and the compared buffered data to generate the compared result, and sets the second byte of the re-write data RWDATA to be the compared buffered data or the inhibiting data according to the new compared result. Moreover, the sense and compare circuit 140 reads the read-out data from the memory cells 110 in sequential till all bytes of the buffered data are compared. The rewrite-in data RWDATA with 16 byte is generated accordingly.

The write circuit 130 receives the rewrite-in data RWDATA from the sense and compare circuit 140, and the write circuit 130 transports the rewrite-in data RWDATA to the page buffer 120 to be a new buffered data. The page buffer 120 re-programs the new buffered data to the memory cells 110. Wherein, when the new buffered data is programmed to the memory cells 110, each byte of the new buffered data is set to be the inhibiting data is not programmed to the memory cells, and each byte of the new buffered data is not set to be the inhibiting data is programmed to the memory cells.

On the other hand, the word line decoder 160 is coupled to the memory cells 110, and the word line decoder provides a plurality of decoded word line signals to the memory cells 110. The sense amplifier 150 is coupled to the Y decoder 170, and the sense amplifier 150 senses the data read from the memory cells 110 for generating the read-out data. The circuit structures of the Y decoder 170, the word line decoder 160, and the sense amplifier 150 are knew by a person skilled in the art, and are not described here.

Figure 2:
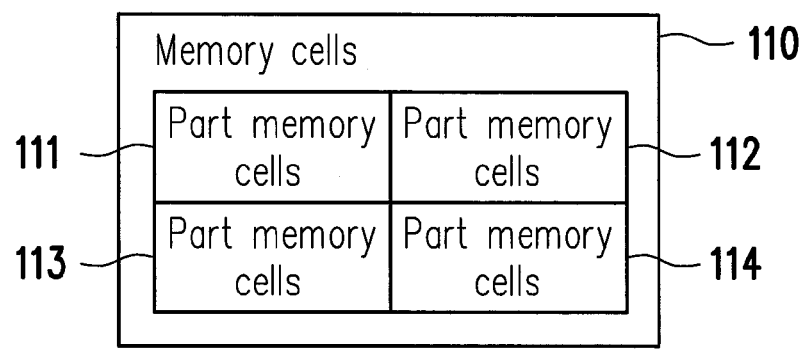
FIG. 2 is a block diagram of the memory cells and the page buffer according to the embodiment of the present invention.
Figure 2:
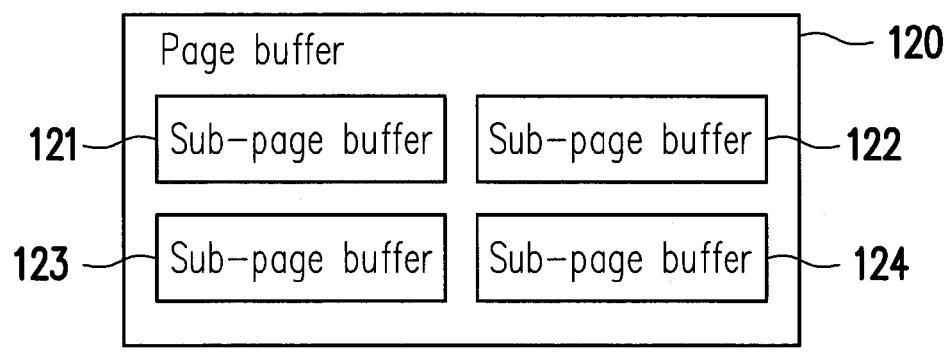

Please referring to FIG. 2, FIG. 2 is a block diagram of the memory cells and the page buffer according to the embodiment of the present invention. In FIG. 2, the memory cells 110 may be divided into a plurality of part memory cells 111-114. The page buffer 121 may be formed by a plurality of sub-page buffers 121-124. In this embodiment, the part memory cells 111-114 are respectively correspond to the sub-page buffers 121-124. That is, for example, when data of the part memory cell 111 is accessed, the sub-page buffer 121 is used to provide buffered data to program the part memory cell 111.

Figure 3:
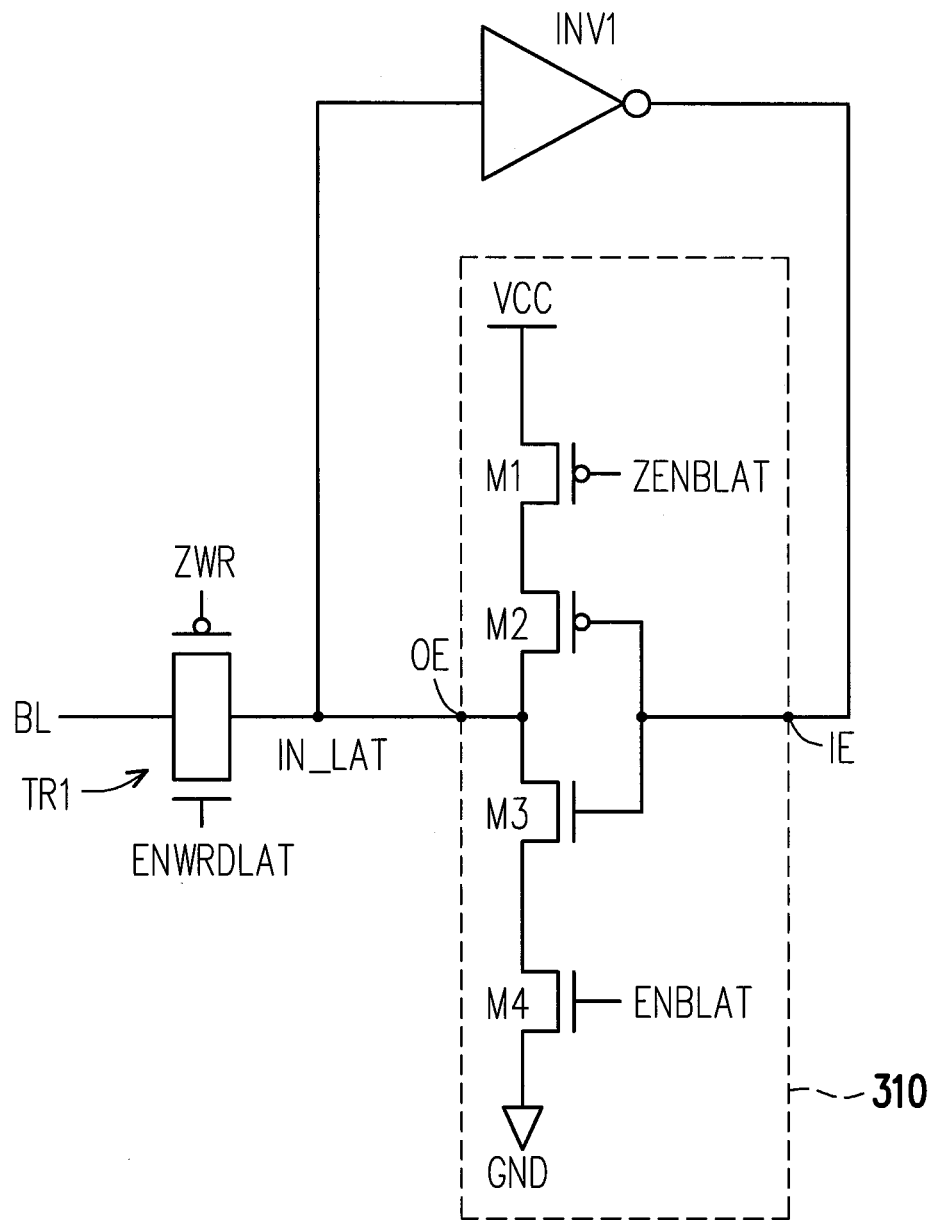
FIG. 3 is a circuit diagram of the page buffer according to the embodiment of the present invention.

Please referring to FIG. 3, FIG. 3 is a circuit diagram of the page buffer according to the embodiment of the present invention. In FIG. 3, the page buffer 300 includes a transmission gate TR1, a first inverter INV1, and a tri-state inverter 310.

The tri-state inverter 310 has an input end IE and an output end OE, and the tri-state inverter 310 is controlled by a latch enable signal ENBLAT and an inverted latch enable signal ZENBLAT. The inverted latch enable signal ZENBLAT and the latch enable signal ENBLAT are complementary. The tri-state inverter 310 includes transistors M1-M4. A first end of the transistor M1 receives a first reference voltage VCC, a control end of the transistor M1 receives the inverted latch enable signal ZENBLAT, and a second end of the transistor M1 is coupled to a first end of the transistor M2. A control end of the transistor M2 is the input end IE of the tri-state inverter 310 and the second end of the transistor M2 is the output end OE of the tri-state inverter 310. A control end of the transistor M3 is coupled to the control end of the transistor M2, a first end of the transistor M3 is coupled to the second end of the transistor M2, and a second end of the transistor M3 is coupled to a first end of the transistor M4. A control end of the transistor M4 receives the latch enable signal ENBLAT, and a second end of the transistor M4 receives a second reference voltage GND. In FIG. 3, the first reference voltage VCC may be an operating voltage of the non-volatile memory apparatus, and the second reference voltage GND may be a ground voltage.

The transmission gate TR1 is coupled between the write circuit of the non-volatile memory apparatus and the output end OE of the tri-state inverter 310. The transmission gate TR1 is controlled by a read-write latch signal ENWRDLAT and a write latch signal ZWR to be turned on or off.

About operation of the page buffer 300, when a data is written to the page buffer 300, the transmission gate TR1 is turned on according to the write latch signal ZWR and the read-write latch signal ENWRDLAT, and the data on a transmission line BL is transported to the output end OE of the tri-state inverter 310. At the same time, the transistors M1 and M4 are turned off according to the latch enable signal ENBLAT, and the data can be written to the input end IE of the tri-state inverter 310 easily. After the data has been written to the input end IE of the tri-state inverter 310, the transmission gate TR1 may be turned off and the transistors M1 and M4 may be turned on. The data can be latched in the page buffer 300 to form the buffered data IN_LAT.

During the verification operation is operated, a voltage level on the transmission line BL may be pulled to logic high by the write circuit. Then, the transmission gate TR1 is turned on by setting the read-write latch signal ENWRDLAT to logic high, and the output of the tri-state inverter drives the transmission line BL through the transmission gate TR1 according to the buffered data IN_LAT, and the voltage level on the transmission line BL is varied according to the buffered data IN_LAT. In detail, if the buffered data IN_LAT is in logic high, the voltage level on the transmission line BL is kept on the logic high, and if the buffered data IN_LAT is in logic low, the voltage level on the transmission line BL is pulled to logic low. That is, the buffered data IN_LAT is read out from the page buffer 300.

Figure 4:
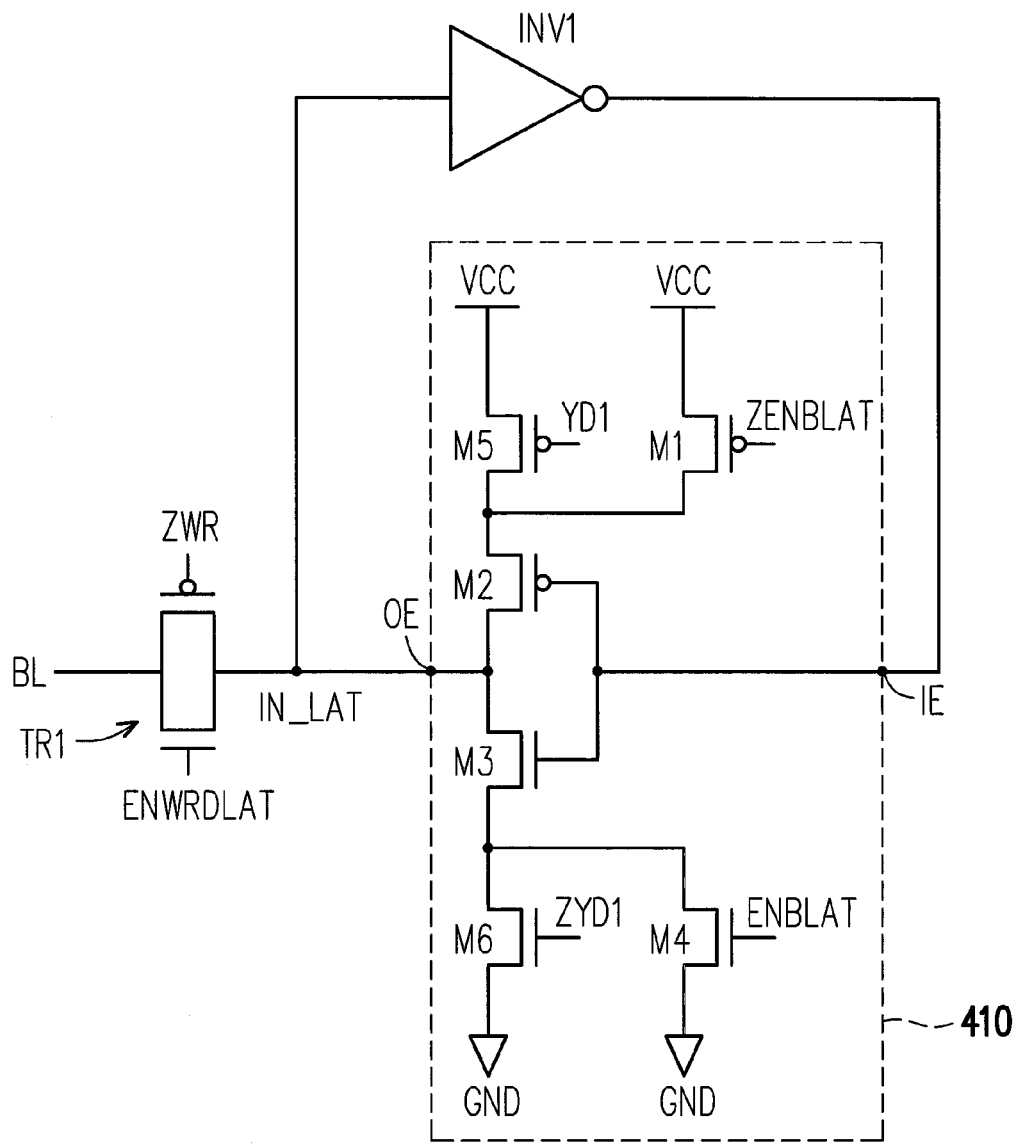
FIG. 4 is another circuit diagram of the page buffer according to the embodiment of the present invention.

Please referring to FIG. 4, FIG. 4 is another circuit diagram of the page buffer according to the embodiment of the present invention. In FIG. 4, the page buffer 400 includes a transmission gate TR1, a first inverter INV1, and a tri-state inverter 410. Different from the tri-state inverter 310, the tri-state inverter 410 of the page buffer 400 further includes transistors M5 and M6. A first end of the transistor M5 receives the first reference voltage VCC, a control end of the transistor M5 receives a Y decode signal YD1, and a second end of the transistor M5 is coupled to the second end of the transistor M1. A second end of the transistor M6 receives the second reference voltage GND, a control end of the transistor M6 receives an inverted Y decode signal ZYD1, and a second end of the transistor M6 is coupled to the first end of the transistor M4. Wherein, the Y decode signal and the inverted Y decode signal ZYD1 are complementary.

Figure 5:
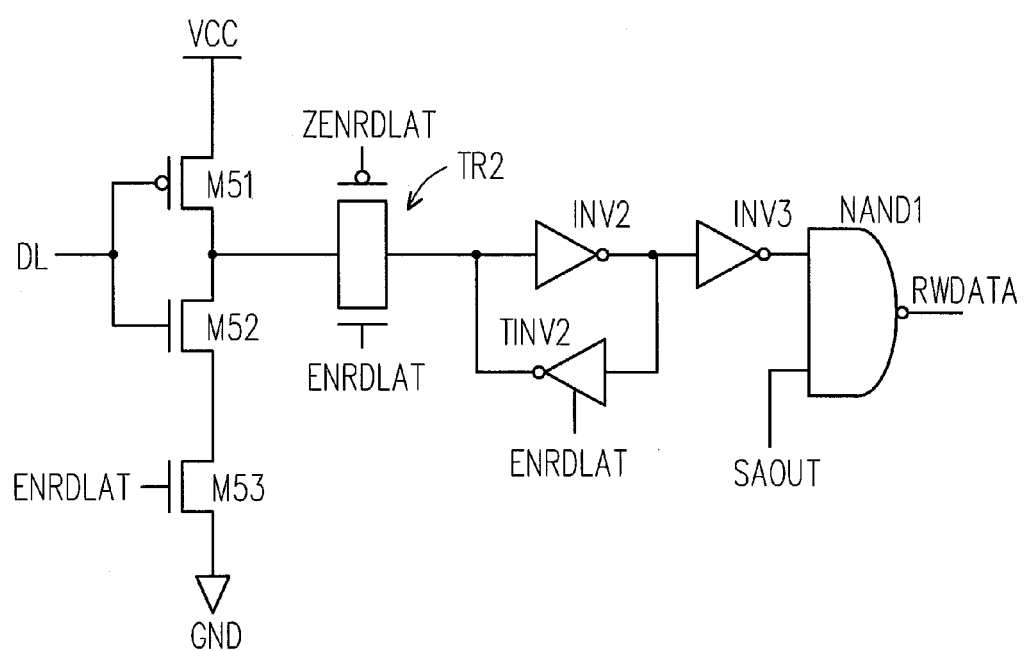
FIG. 5 is a circuit diagram of the sense and compare circuit according to the embodiment of the present invention.

Please referring to FIG. 5, FIG. 5 is a circuit diagram of the sense and compare circuit according to the embodiment of the present invention. The sense and compare circuit 500 includes transistors M51-M53, transmission gate TR2, inverters INV2-INV3, a tri-state inverter TINV2, and a NAND gate NAND1. A first end of the transistor M51 is coupled to the first reference voltage VCC, a control end of the transistor M51 is coupled to a data line DL, and a second end of the transistor M51 is coupled to a first end of the transistor M52. A control end of the transistor M52 is coupled to the data line DL, and a second end of the transistor M52 is coupled to a first end of the transistor M53. A control end of the transistor M53 receives a read buffered data signal ENRDLAT, and a second end of the transistor M53 receives the second reference voltage GND. The second end of the transistors M51 is coupled to one end of the transmission gate TR2, and another end of the transmission gate TR2 is coupled to an input end of the inverter INV2. The input end of the inverter INV2 is also coupled to an output end of the tri-state inverter TINV2, and an output end of the inverter INV2 is coupled to an input end of the tri-state inverter TINV2 and an input end of the inverter INV3. Besides, the tri-state inverter TINV2 is controlled by the read buffered data signal ENRDLAT. Two input end of the NAND gate NAND1 are coupled to an output end of the inverter INV3 and an end for receiving the read-out data SAOUT. An output end of the NAND gate NAND1 generates the rewrite-in data RWDATA. The data line DL is coupled to the Y decoder.

In the operation of the sense and compare circuit 500, when the read buffered data signal ENRDLAT is logic high, the buffered data transported from the data line DL is latched in a latch formed by the inverter INV2 and the tri-state inverter TINV2. The buffered data is also compared with the read-out data SAOUT from memory cells by the NAND gat NAND1. The rewrite-in data RWDATA is generated by NAND the inverted buffered data and the read-out data SAOUT.

Figure 6:
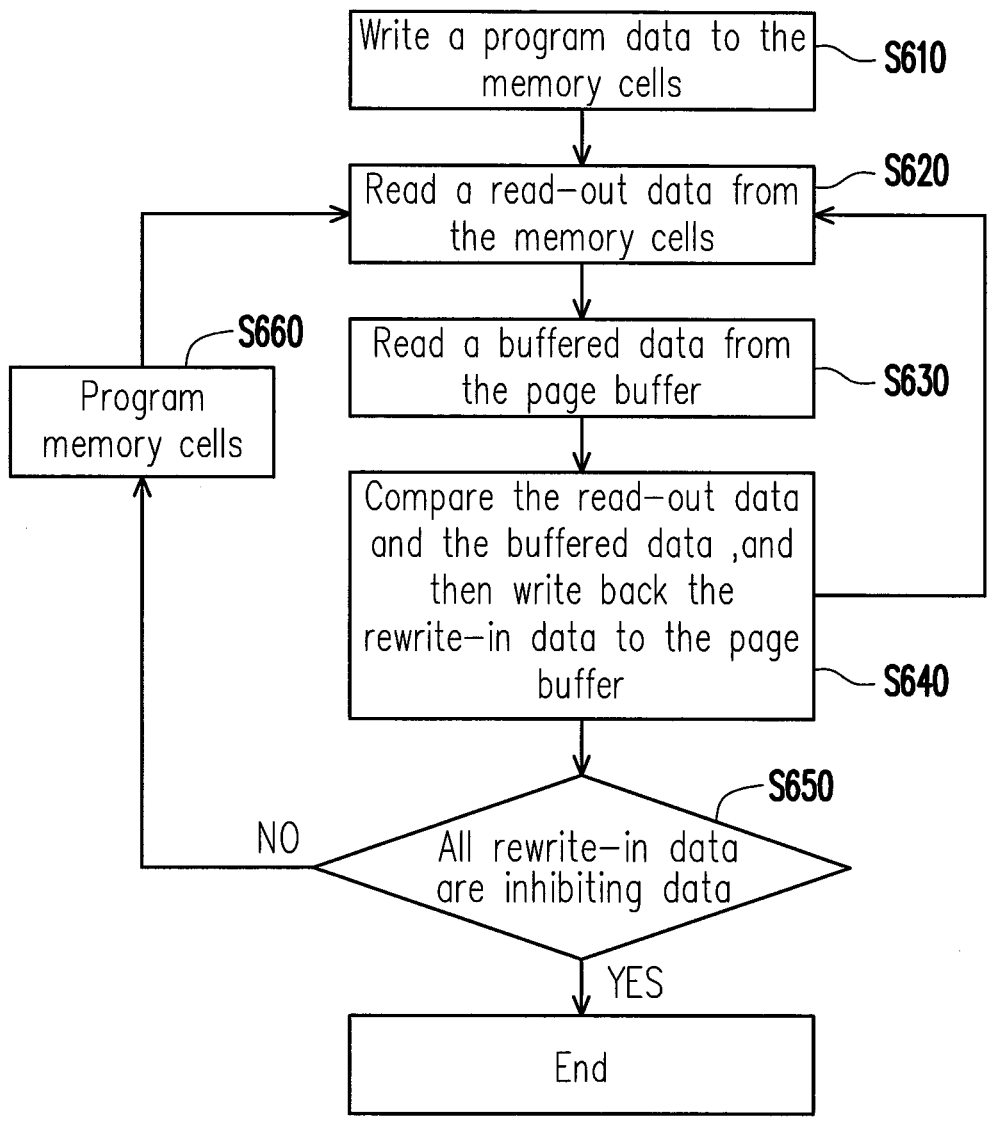
FIG. 6 is a flow chart of a data verification method for a non-volatile memory apparatus according to the embodiment of the present invention.

Please referring to FIG. 6, FIG. 6 is a flow chart of a data verification method for a non-volatile memory apparatus according to the embodiment of the present invention. In the step S610, a program data is programmed to a plurality of memory cells of the non-volatile memory by a write circuit and a page buffer. In the step S620, a read-out data is read from the memory cells by a sense amplifier, and in the step S630, a buffered data is read from the page buffer. The sense and compare circuit compares the read-out data and the buffered data to set the rewrite-in data, and write back the rewrite-in data to the page buffer to replace buffered data in step S640. Please notice here, the sense and compare circuit may read the buffered data with one byte at once to compare one byte data of the read-out data. Such as that, the steps S620, S630 and S640 may be executed repeatedly till all bytes of the buffered data are compared. If all of the rewrite-in data are inhibiting data, the flow of data verification is complete.

In summary, the disclosure provides a sense and compare circuit for reading the buffered data, and the sense and compare circuit compares the read-out data and the buffered data to generate a rewrite-in data. By setting the rewrite-in data to be inhibiting data or the read-out data, the memory cells which are programmed correctly can avoid to be programmed again by the inhibiting data. The memory cells which are programmed incorrectly can be programmed again. An endurance and accuracy of the memory cells of the non-volatile memory can be improved.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A non-volatile memory apparatus, comprising:
a plurality of memory cells;
a page buffer, coupled to the memory cells, storing a plurality of buffered data and programming the plurality of memory cells according to the plurality of buffered data;
a sense amplifier, sensing data read from the memory cells for generating a read-out data;
a write circuit, coupled to the page buffer, receiving a program data or a rewrite-in data and writing the program data or the rewrite-in data to the page buffer to be one of the buffered data; and
a sense and compare circuit, coupled to the page buffer and the write circuit, reading the buffered data, and comparing the read-out data and the buffered data to generate a compared result, wherein, the sense and compare circuit determines the rewrite-in data to be the program data or an inhibiting data according to the compared result,
wherein the page buffer comprises:
a tri-state inverter, has an input end and an output end, the tri-state inverter is controlled by a latch enable signal;
an inverter, has an input end and an output end, the input end of the inverter is coupled to the output end of the tri-state inverter, the output end of the inverter is coupled to the input end of the tri-state inverter; and
a transmission gate, coupled between the write circuit and the output end of the tri-state inverter, the transmission gate is controlled by a read-write latch signal and a write latch signal to be turned on or off.

2. The non-volatile memory apparatus according to claim 1, wherein the memory cells comprises a plurality of part memory cells, and the page buffer comprises a plurality of sub-page buffers, the part memory cells are respectively corresponded to the sub-page buffers.

3. The non-volatile memory apparatus according to claim 1, wherein the tri-state inverter comprises:
a first transistor, has a first end, a second end and a control end, the first end of the first transistor receives a first reference voltage, the control end of the first transistor receives an inverted latch enable signal;
a second transistor, has a first end, a second end and a control end, the first end of the second transistor is coupled to the second end of the first transistor, the control end of the second transistor is the input end of the tri-state inverter, the second end of the second transistor is the output end of the tri-state inverter;
a third transistor, has a first end, a second end and a control end, the first end of the third transistor is coupled to the second end of the second transistor, the control end of the third transistor is coupled to the control end of the second transistor; and
a fourth transistor, has a first end, a second end and a control end, the first end of the fourth transistor is coupled to the second end of the third transistor, the second end of the fourth transistor is coupled to a second reference voltage, and the control end of the fourth transistor receives the latch enable signal.

4. The non-volatile memory apparatus according to claim 3, wherein the tri-state inverter further comprises:
a fifth transistor, has a first end, a second end and a control end, the first end of the fifth transistor is coupled to the first reference voltage, the second end of the fifth transistor is coupled to the second end of the first transistor, and the control end of the fifth transistor receives a Y decode signal; and a sixth transistor, has a first end, a second end and a control end, the second end of the sixth transistor is coupled to the second reference voltage, the first end of the sixth transistor is coupled to the first end of the fourth transistor, and the control end of the sixth transistor receives an inverted Y decode signal.

5. The non-volatile memory apparatus according to claim 1, wherein the sense and compare circuit comprises:

a first transistor, has a first end, a second end and a control end, the first end of the first transistor receives a first reference voltage, a control end of the first transistor receives the buffered data;

a second transistor, has a first end, a second end and a control end, the first end of the second transistor is coupled to the second end of the first transistor, the control end of the second transistor receives the buffered data;

a third transistor, has a first end, a second end and a control end, the first end of the third transistor is coupled to the second end of the second transistor, the control end of the third transistor receives a read buffered data signal, and the second end of the third transistor is coupled to a second reference voltage;

a transmission gate, has a first end coupled to the second end of the first transistor, the transmission gate is controlled by the read buffered data signal to be turned on or off;

a first inverter, has a input end coupled to a second end of the transmission gate;

a tri-state inverter, has a input coupled to an output end of the first inverter, an output end of the tri-state inverter is coupled to the input end of the first inverter, the tri-state inverter is controlled by the read buffered data signal;

a second inverter, has an input end coupled to the output end of the first inverter; and a NAND gate, has a first input end coupled to an output end of the second inverter, a second input end of the NAND gate receives the read-out data, and an output end of the NAND gate generates the rewrite-in data.

6. The non-volatile memory apparatus according to claim 1, further comprising:

a Y decoder, coupled to the page buffer;

a word line decoder, coupled to the memory cells, the word line decoder providing a plurality of decoded word line signals to the memory cells; and a sense amplifier, coupled to the Y decoder, the sense amplifier sensing data read from the memory cells for generating the read-out data.

\* \* \* \* \*